United States Patent [19]

Kotani

[11] Patent Number: 4,974,205
[45] Date of Patent: Nov. 27, 1990

[54] JOSEPHSON MEMORY AND READ/WRITE CIRCUIT

[75] Inventor: Seigo Kotani, Zama, Japan

[73] Assignee: Fujitsu Limited, Kawasaki, Japan

[21] Appl. No.: 426,074

[22] Filed: Oct. 23, 1989

[30] Foreign Application Priority Data

Oct. 24, 1988 [JP] Japan ................. 63-267886

[51] Int. Cl.$^5$ ............... G11C 11/44; H03K 3/38; H03K 5/13; H03L 7/00
[52] U.S. Cl. ................. 365/162; 307/306; 307/269
[58] Field of Search ............ 365/160, 162; 307/269, 307/306

[56] References Cited

FOREIGN PATENT DOCUMENTS 63-98219  4/1988  Japan .

OTHER PUBLICATIONS

S. M. Faris et al., "Basic Design of a Josephson Technology Cache Memory", IBM J. Res. Develop, vol. 24, No. 2, Mar. 1980.
W. H. Henkels, "Josephson Feedback Memory Cells", IBM Technical Disclosure Bulletin, vol. 18, No. 11, Apr. 1976.
W. H. Henkels, "Low-Current-Level Widest-Margin Josephson NDRO Cell", IBM Technical Disclosure Bulletin, vol. 21, No. 1, Jun. 1978.

Primary Examiner—Stuart N. Hecker
Assistant Examiner—Jack Lane
Attorney, Agent, or Firm—Staas & Halsey

[57] ABSTRACT

A Josephson memory circuit driven by first, second and third clock signals includes a write circuit which holds data as a circulating current circulating in a superconducting closed loop including a Josephson junction. The data to be held is supplied thereto through a data line with timing of the third clock signal. A first OR circuit is supplied with a bias from a read bias line with timing of the second clock signal and supplied with the circulating current. The first OR circuit has a Josephson junction which is switched to a finite resistance state by the circulating current. A second OR circuit is supplied as a bias with output data form the first OR circuit with timing of the second clock signal and supplied with a read address signal from a read address line with timing of the first clock signal. The second OR circuit has a Josephson junction which is switched to a finite resistance state by the read address signal. A third OR circuit is supplied with a bias from a read line with timing of the second clock signal and supplied with output data from the second OR circuit. The third OR circuit has a Josephsoh junction which is switched to a finite resistance state by the output data supplied from the second OR circuit. The data held in the write circuit is read out therefrom and transferred to the read line through the first, second and third OR circuits in this order.

11 Claims, 4 Drawing Sheets

PREOR ART

— TIME

JOSEPHSON MEMORY AND READ/WRITE CIRCUIT

BACKGROUND OF THE INVENTION

The present invention generally relates to a Josephson memory circuit which includes Josephson junctions serving as memory cells.

Recently, an integrated circuit which uses a niobium (Nb) Josephson junction has been developed. A logic gate which uses a Josephson element enables high-speed switching operation with low power consumption. Thus, a high-speed processor can be achieved by Josephson junctions. As logic gates are configured to operate at higher speed, a memory circuit is also required to operate at high speed.

Referring to FIG. 1, there is illustrated a conventional Josephson memory circuit which serves as a single memory cell. Data is applied to a write circuit 10 at the same time as a write address is applied thereto. The applied data is held as a current which circulates in a superconducting closed loop 10a including a Josephson junction. The presence and non-presence of the circulating current correspond to data '1', and '0', respectively. A read circuit 11 is magnetically coupled to the superconducting closed loop 10a and a read address line 12. The read circuit 11 performs an AND operation on a first state where there is the circulating current and a second state where a read address is being applied to the read address line 12. When the AND logic is satisfied, the read circuit 11 switches its state and reads out data from the write circuit 10. A memory cell array is formed by a large number of memory circuits each having the structure shown in FIG. 1.

A memory cell array as described above is formed on a chip independently or with logic gates of a memory peripheral circuit. In either case, a large number of memory circuits is formed on a chip. In order to take into account dispersion in various parameters with respect to the memory circuits and let the memory circuit operate stably, each of the memory circuits must have a large operating margin.

However, data in the write circuit 10 is read out on the basis of the AND logic by the read circuit 11 as described previously. This is further described with reference to FIG. 2. FIG. 2 is a graph of a threshold characteristic of the read circuit 11. The horizontal axis of the graph represents an input signal current, and the vertical axis thereof represents a bias current passing through a read line 13. A hatched area represents a superconducting state, and an area other than the hatched area represents a finite resistance state. The read circuit 11 switches from the superconducting state to the finite resistance state when the bias current becomes equal to ib in the finite resistance state and an input signal current for the read circuit 11 becomes equal to 2ia in the finite resistance state. The input signal current corresponds to the sum of the circulating current& ia and the read address current ia. That is, the read circuit 11 must discriminate the presence of the input signal current 2ia with the bias current ib applied thereto from other states. It follows that the read circuit 11 has a small operating margin with respect to a fluctuation of the bias current and a fluctuation of each of the circulating current and the read address current. Thus, the read circuit 11 frequently malfunctions.

SUMMARY OF THE INVENTION

Accordingly, a general object of the present invention is to provide an improved Josephson memory circuit in which the aforementioned disadvantages are eliminated.

A more specific object of the present invention is to provide a Josephson memory circuit having an increased operating margin so that it can operate correctly even when the bias current or the input signal current fluctuates.

The above objects of the present invention can be achieved by a Josephson memory circuit driven by first, second and third clock signals, comprising a write circuit which holds data as a circulating current circulating in a superconducting closed loop including a Josephson junction. The data to be held is supplied thereto through a data line with timing of the third clock signal A first OR circuit is supplied with a bias from a read bias line with timing of the second clock signal and supplied with the circulating current. The first OR circuit has a Josephson junction which is switched to a finite resistance state by the circulating current. A second OR circuit is supplied as a bias with output data from the first OR circuit with timing of the second clock signal and supplied with a read address signal from a read address line with timing of the third clock signal. The second OR circuit has a Josephson junction which is switched to a finite resistance state by the read address signal. A third OR circuit is supplied with a bias from a read line with timing of the second clock signal and supplied with output data from the second OR circuit. The third OR circuit has a Josephson junction which is switched to a finite resistance state by the output data supplied from the second OR circuit. The data held in the write circuit is read out therefrom and transferred to the read line through the first, second and third OR circuits in this order.

Additional objects, features and advantages of the present invention will become apparent from the following detailed description when read in conjunction with the accompanying drawings.

DESCRIPTION OF THE PREFERRED EMBODIMENTS

Figure 3:
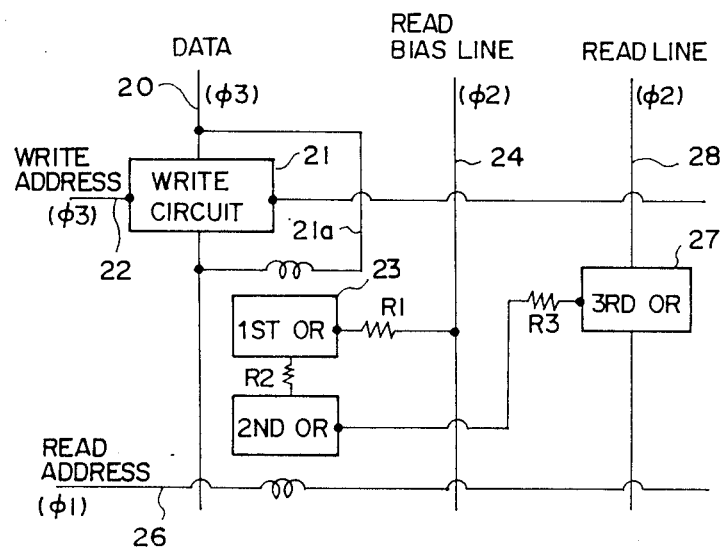
FIG. 3 is a block diagram of a preferred embodiment of the present invention.
Figure 4:
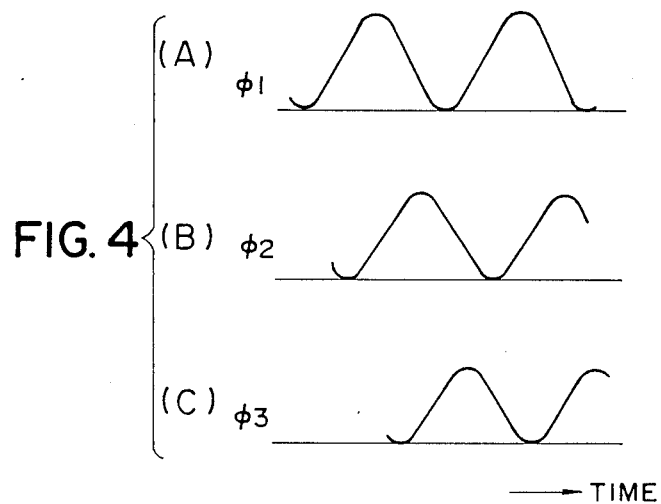
FIG. 4 is a waveform diagram of first, second and third clock signals used in the configuration shown in FIG. 3.

A description is given of a first preferred embodiment of the present invention with reference to FIGS. 3 and 4.

A write circuit 21 is provided with data from a data line 20 and a write address from a write address line 22 with timing of a third clock signal $\phi_3$, as shown in FIG. 4(C). The supplied data is written in the write circuit 21. That is, the write circuit 21 holds the written data as a circulating current on a superconducting closed loop 21a including a Josephson junction. A first OR circuit 23 is supplied with a bias from a read bias line 24 through a resistor R1 with timing of a second clock signal $\phi_2$ as shown in FIG. 4(B), which is different from that of the clock signal $\phi_3$ for use in data writing. The state of the circuit OR circuit 23 is switched by the presence of the circulating current that circulates in the superconducting closed loop 21a. A second OR circuit 25 is supplied, as a bias, with output data supplied from the first OR circuit 23 through a resistor R2, and a read address on a read address line 26 with timing of a first clock signal $\phi_1$ as shown in FIG. 4(A), which is different from the timing $\phi_3$ for use in data writing. The state of the second OR circuit 25 is switched when the read address is supplied thereto with the bias supplied thereto. A third OR circuit 27 is supplied with a bias from a read line 28 with timing of the clock signal $\phi_2$. The third OR circuit 27 has a Josephson junction, the state of which is switched by output data supplied from the second OR circuit 25 through a resistor R3. The data read out from the write circuit 21 is supplied to the read line 28 through the first, second and third OR circuits 23, 25 and 27. The clock signals $\phi_1$, $\phi_2$ and $\phi_3$ are D.C.—biased alternating signals which are mutually 120 degrees out of phase. The first clock signal $\phi_1$ leads the second signal $\phi_2$, by a phase of 120 degrees, and the second clock signal $\phi_2$ leads the third clock signal $\phi_3$ by a phase of 120 degrees.

An essential feature of the configuration shown in FIG. 3 is that data stored in the write circuit 21 is read out on the basis of OR operations in the first, second and third OR circuits 23, 25 and 27. With this structure, it becomes possible to take a large operating margin. Additionally, it is possible to prevent the memory circuit from malfunctioning since the first, second and third, OR circuits 23, 25 and 27 operate with timing which are different from timing for use in data writing.

Figure 5:
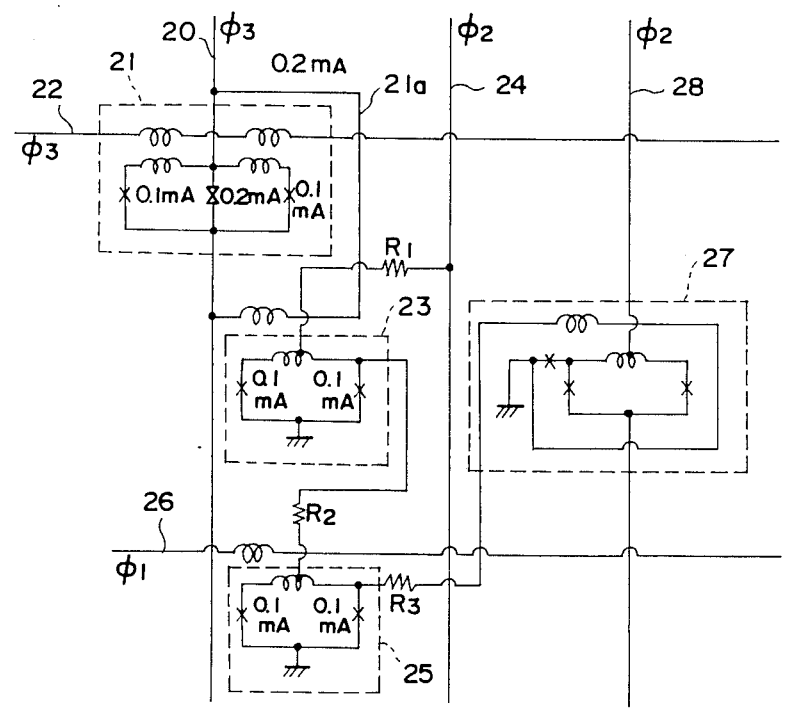
FIG. 5 is a circuit diagram of the configuration shown in FIG. 3.

A further description is given of the embodiment with reference to FIG. 5, which is an equivalent circuit diagram of the embodiment shown in FIG. 3.

Referring to FIG. 5, the write circuit 21 coupled to the data line 20 is formed by a three-junction superconducting quantum interference device (abbreviated as SQUID) having a critical current equal to 0.4 mA. The write address line 22 is magnetically coupled to the write circuit 21. Data and write address are supplied to the write circuit 21 with timing of clock signal $\phi_3$. When data '1', is supplied to the write circuit 22 with timing of the clock $\phi_3$, the Josephson junction in the write circuit 21 switches from the superconducting state to the finite resistance state. This change of the state generates the aforementioned circulating current which circulates in the superconducting closed loop 21a. When data '0', is supplied to the write circuit 21 with timing of the clock signal $\phi_3$, no current circulates in the superconducting closed loop 21a since the Josephson junction is in the superconducting state. When data '1'held in the superconducting closed loop 21a is rewritten so as to be replaced by data '0', the write address is supplied to the write circuit 21 through the write address line 22 in the presence of the circulating current. Thus, the Josephson junction in the write circuit 21 is switched to the finite resistance state, and the circulating current decreases to zero in a moment. Thereby, data '0', is held in the write circuit 21.

The first OR circuit 23 is formed by a two-junction superconducting quantum interference device having a critical current of 0.2 mA, which is equal to the circulating current which circulates in the superconducting closed loop 21a. The first OR circuit 23 is magnetically coupled to the superconducting closed loop 21a, and is supplied with the read bias from the read bias line 24 through the resistor R1 with timing of the clock signal $\phi_2$. The value of the bias current of a standard logic circuit is equal to 0.4 mA, and a connecting resistor between the standard logic circuit and a power supply bus is equal to 60 ohms. From this viewpoint, the value of the resistor R1 is set equal to 120 ohms, for example.

The first OR circuit 23 switches its state with timing of the clock signal $\phi_2$ when data held in the write circuit 21 is '1', and the circulating current exists in the superconducting closed loop 21a. At this time, the Josephson junction of the first OR circuit 23 is switched to the finite resistance state, and thus data '1', is output on the side of the resistor R2. That is, the first OR circuit 23 is a one-input OR circuit supplied with the data held in the write circuit 21.

It is preferable that the value of the resistor R2 is set as small as possible in order to prevent current passing therethrough from being attenuated. The lower limit of resistance of the resistor R2 is based on a load resistance which generates a voltage enabling it to be possible to stably switch the state of the first OR circuit 23. The value of the resistor R2 is set equal to 8 ohms, for example. The resistor R2 having a resistance of 8 ohms generates a voltage of 1 mV for a 60% bias. In this case, an amount of attenuation due to the presence of the resistor R2 is approximately 6%, which does not prevent the second OR circuit 25 from operating correctly.

The second OR circuit 25 is formed by a two-junction superconducting quantum interference device having a critical current of 0.2 mA. The second OR circuit 25 is supplied with the output signal (data) derived from the first OR circuit 23 through the resistor R2, and is magnetically coupled to the read address line 26. The read address is supplied with the second OR circuit 25 with timing of the clock signal $\phi_1$. The second OR circuit 25 is biased by data '1', supplied from the first OR circuit 23 through the resistor R2. In this state, when the read address is supplied to the second OR circuit 25 from the read address line 26, it switches its state to the finite resistance state. Thereby, data '1', is output from the second OR circuit 25, and supplied to the third OR circuit 27 through the resistor R3, which is set equal to 8 ohms, for example. The clock signals $\phi_1$ and $\phi_2$ are 120 degrees out of phase, and are D.C.—biased. Thus, the first and second OR circuits 23 and 25 can switch their states during the overlapping period. There is no power consumption in the read address line 26 because the read address line 26 is magnetically coupled to the second OR circuit 25. Thus, it is possible to supply a plurality of memory circuits arranged in the direction of extending the read address line 26 with power without amplifying the read address signal. That is, serial addressing with respect to the arranged memory circuits is possible without amplifying the read address signal on the read address line 26.

The third OR circuit 27 is formed by a modified variable threshold logic (abbreviated as MVTL) of high input sensitivity. This is based on the fact that the input signals with respect to the OR circuits 23 and 25, that is, the circulating current and the read address signals are large, while the input signal with respect to the third OR circuit 27 is small because the output signal of the second OR circuit 25 is attenuated through the resistor R3 and supplied to the third OR circuit 27. As will be described in detail later, a plurality of third OR circuits each having the same structure as the third OR circuit 27 are provided in the read line 28 so as to be connected in series. The third OR circuit 27 is biased with timing of the clock signal $\phi_2$. In this state, when data '1', is supplied to the third OR circuit 27 from the second OR circuit 25 through the resistor R3, the third OR circuit 27 switches its state from the superconducting state to the finite resistance state. Thus, data '1', appears on the read line 28.

Figure 6:
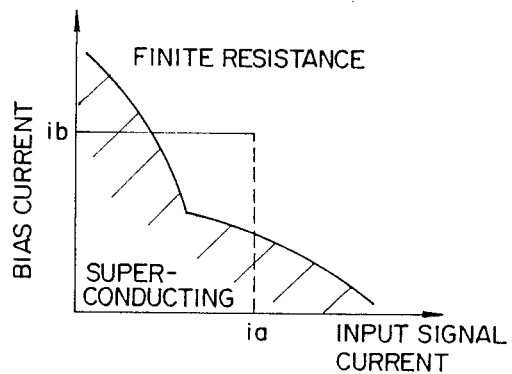
FIG. 6 is a graph of a threshold characteristic of an OR circuit used in the embodiment.

FIG. 6 is a graph of a threshold characteristic of each of the first and second OR circuits 23 and 25. Each of the first and second OR circuits 23 and 25 switches its state when a bias current ib and a single input signal current ia are applied thereto. Thus, an operating margin of such an OR operation is considerably larger than the aforementioned AND operation in which the read circuit 11 switches its state when two input signal currents are applied thereto. The third OR circuit 27 also has a large operating margin. Thus, the memory circuit shown in FIG. 5 is not affected by a fluctuation of the bias current and a fluctuation of the input signal current so that the memory circuit shown in FIG. 5 is prevented from malfunctioning. It is noted that power is mainly consumed through the resistor R1 and there is a slightly large power consumption, as compared with the prior circuit. However, it should be appreciated that the establishment of stable operation of memory circuits is attractive even in the presence of a slight increase of power consumption.

Figure 7:
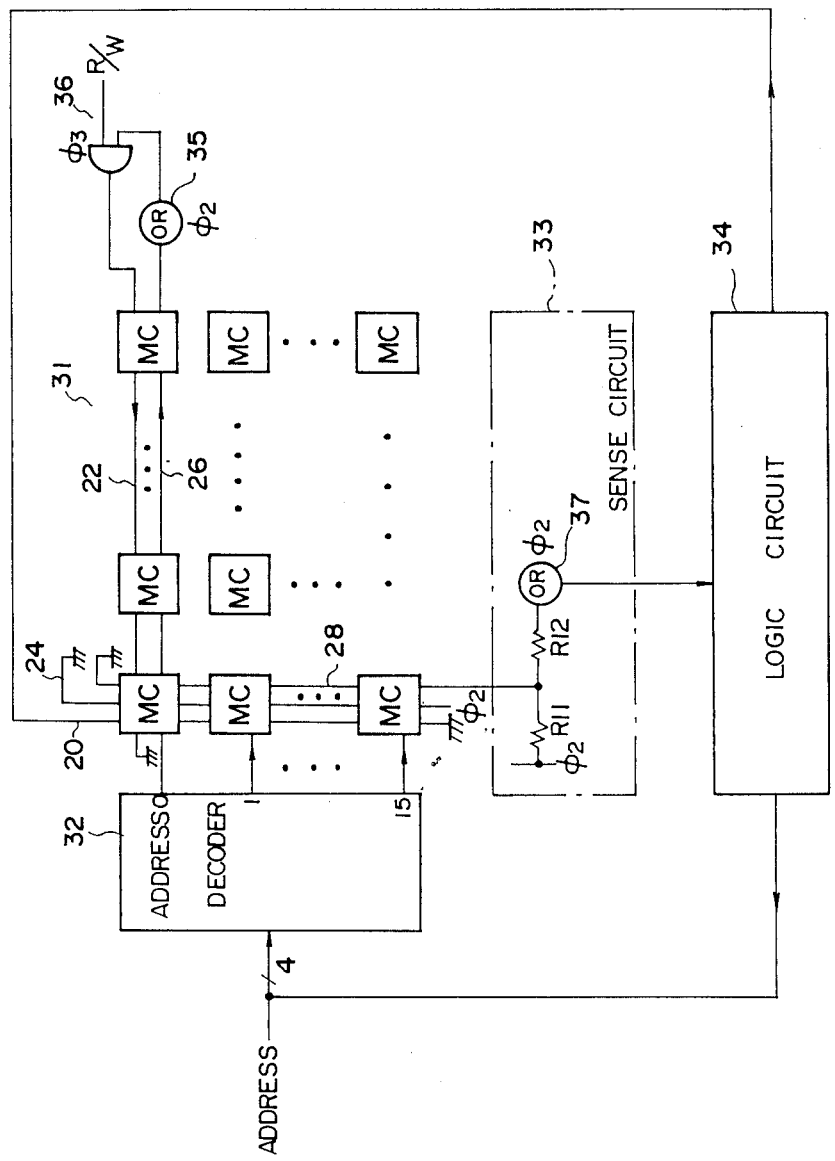
FIG. 7 is a block diagram of a Josephson memory device including a memory cell array and a logic circuit.

Referring to FIG. 7, there is illustrated a Josephson memory device formed on a chip. The Josephson memory device includes a memory array 31, a address decoder 32, a sense circuit 33 and a logic circuit 34. The memory array 31 is made up of a plurality of memory circuits MC (cells) arranged in an array. Each of the memory circuits MC is of the same structure as the memory circuit shown in FIG. 5. The address decoder 32 is supplied with are address signal (four bits, for example) from an external device (not shown) or the logic circuit 34. In the case where the address signal consists of four bits, the address decoder 32 generates 16 decoded address bits, which are supplied to the respective read address lines 26. An OR circuit 35 is connected to an end of each of the read address lines 26. The OR circuit 35 switches its state with timing of the clock signal $\phi_2$. The output of the OR circuit 35 is connected to an input of an AND circuit 36, which is supplied with a read/write switching signal R/W from an external circuit. The AND circuit 36 switches its state with timing of the clock signal $\phi_3$. The output of the AND circuit 36 is connected to the corresponding write address line 22.

The sense circuit 33 includes resistors R11, R12 and an OR circuit 37, all of which are provided for each of the read lines 28. The values of the resistors R11 and R12 are set to 60 ohms and 8 ohms, respectively, for example. The node of the resistors R11 and R12 is connected to an end of the corresponding read line 28, the other end of which is connected to ground. The resistor R11 is biased by the clock signal $\phi_2$. The OR circuit 37, which is connected to the resistor R12, switches its state with timing of the clock signal $\phi_2$. The output of the OR circuit 37 is supplied to the logic circuit 34. When all the OR circuits 27 connected to the read line 28 in series are in the superconducting state, current passes through the OR circuits 27 from the line of the clock signal $\phi_2$, and no current passes to resistor R12. When any one of the OR circuits 27 is switched to the finite resistance state, the current from the line is divided into two components, one of which is directed to the series-connected OR circuits 27, and the other component is directed to the OR circuit 37 through the resistor R12. Thereby, the OR circuit 37 switches its state from the superconducting state to the finite resistance state so that it lets the logic circuit 34 know the occurrence of data on the read line 28. This is done with timing of the clock signal $\phi_2$.

The logic circuit 34 operates with timing of the clock signal $\phi_3$. That is, with timing of the clock signal $\phi_3$, the logic circuit 34 processes data sensed by the sense circuit 33 with timing of the clock signal $\phi_2$, and outputs data obtained by data processing. The data is supplied to the memory cells MC with timing of the clock signal $\phi_3$. In this case, if the read/write switching signal indicates data write, the read address supplied from the address decoder 32 is transferred to the AND circuit 36 through the OR circuit 35. Then the transferred read address is supplied, as a write address, to the write address line 26 with timing of the clock signal $\phi_3$. Thus, the data in the memory cell MC may be rewritten. The data output from the logic circuit 34 may be used as an address signal to be supplied to the address decoder 32. As described above, data reading is carried out with timing which is different from timing for data writing. Thus the occurrence of racing can be prevented.

Alternatively, it is possible to configure the first, second and third OR circuit 23, 25 and 27 by use of three-junction superconducting quantum interface device.

The present invention is not limited to the aforementioned embodiments, and variations and modifications may be made without departing from the scope of the present invention.

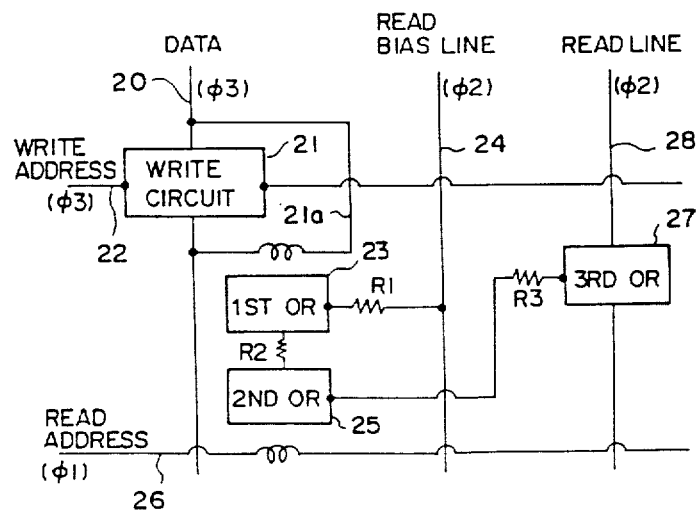

What is claimed is:

1. A Josephson memory circuit driven by first, second and third clock signals, comprising:
    writing means for holding data as a circulating current circulating in a superconducting closed loop including a Josephson junction, said data being supplied thereto through a data line with timing of said third clock signal;
    a first OR circuit supplied with a bias from a read bias line with timing of said second clock signal and supplied with said circulating current, said first OR circuit having a Josephson junction which is switched to a finite resistance state by said circulating current;
    a second OR circuit supplied as a bias with output data from said first OR circuit with timing of said second clock signal and supplied with a read address signal from a read address line with timing of said first clock signal, said second OR circuit having a Josephson junction which is switched to a finite resistance state by said read address signal; and
    a third OR circuit supplied with a bias from a read line with timing of said second clock signal and supplied with output data from said second OR circuit, said third OR circuit having a Josephson junction which is switched to a finite resistance state by said output data supplied from said second OR circuit, said data held in said writing means being read out therefrom and transferred to said read line through said first, second and third OR circuits in this order.

2. A Josephson memory circuit as claimed in claim 1, further comprising a resistor which connects said first OR circuit to said read bias line, and said bias to be supplied to said first OR circuit is supplied thereto through said resistor from said read bias line.

3. A Josephson memory circuit as claimed in claim 1, further comprising a resistor which connects said second OR circuit to said first OR circuit, and said output data supplied from said first OR circuit is supplied to said second OR circuit through said resistor.

4. A Josephson memory circuit as claimed in claim 3, wherein said resistor has a resistance which enables said first OR circuit to stabely switch its state.

5. A Josephson memory circuit as claimed in claim 1, further comprising a resistor which connects said third OR circuit to said second OR circuit, and said output data supplied from said second OR circuit is supplied to said third OR circuit through said resistor.

6. A Josephson memory circuit as claimed in claim 1, wherein said first OR circuit is magnetically coupled to said superconducting closed loop, and said second OR circuit is magnetically coupled to said read address line.

7. A Josephson memory circuit as claimed in claim 1, wherein each of said first and second OR circuits includes a two-junction superconducting quantum interference device.

8. A Josephson memory circuit as claimed in claim 1, wherein said third OR circuit includes a modified variable threshold logic device.

9. A Josephson memory circuit as claimed in claim 1, wherein said first, second and third clock signals are mutually 120 degrees out of phase.

10. A Josephson memory circuit as claimed in claim 1, wherein said first clock signal leads said second clock signal by a phase of 120 degrees, and said second clock signal leads said third clock signal by a phase of 120 degrees.

11. A Josephson memory circuit as claimed in claim 1, wherein said writing means includes three-junction superconducting quantum interference device.

* * * * *

UNITED STATES PATENT AND TRADEMARK OFFICE
CERTIFICATE OF CORRECTION

PATENT NO. : 4,974,205

DATED : Nov. 27, 1990

INVENTOR(S) : KOTANI

Page 1 of 2

It is certified that error appears in the above-identified patent and that said Letters Patent is hereby corrected as shown below:

The title page showing the ABSTRACT and the illustrative figure, should be deleted and substitute therefor the attached title page.

Figure 1:
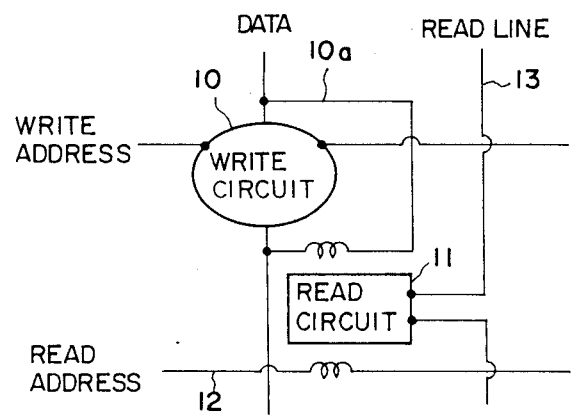
FIG. 1 is a circuit diagram of a conventional Josephson memory circuit.
Figure 2:
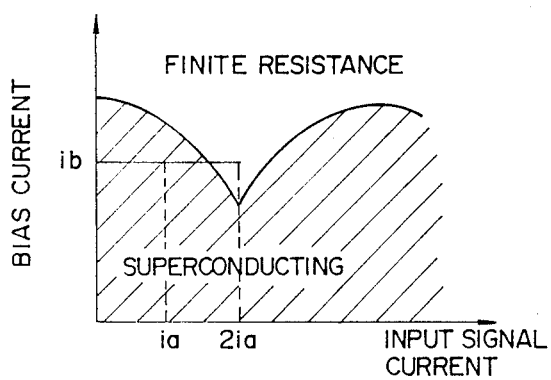
FIG. 2 is a graph of a threshold characteristic of a read circuit shown in FIG.1.

Sheet 1 of 4, FIG. 1, change "PREOR" to --PRIOR--.

Sheet 2 of 4, FIG. 3, as to the second OR circuit block "2ND OR", add identifying numeral --25-- and an associated reference line.

Col. 1,  line 27, change "l0a" to --10a--;
         line 61, change "rent&" to --rent--.

Col. 2,  line 18, after "signal" insert --.--.

Col. 5,  line 38, change "a address" to --an address--.

Col. 6,  line 35, after "use of" insert --a--.

Col. 7   line 19, change "stabely" to --stably--.

Col. 8,  line 23, after "includes" insert --a--.

Signed and Sealed this

Twenty-fifth Day of May, 1993

Attest:

MICHAEL K. KIRK

*Attesting Officer*  Acting Commissioner of Patents and Trademarks

United States Patent [19]

Kotani

[11] Patent Number: 4,974,205
[45] Date of Patent: Nov. 27, 1990

[54] JOSEPHSON MEMORY AND READ/WRITE CIRCUIT

[75] Inventor: Seigo Kotani, Zama, Japan
[73] Assignee: Fujitsu Limited, Kawasaki, Japan
[21] Appl. No.: 426,074
[22] Filed: Oct. 23, 1989
[30] Foreign Application Priority Data
  Oct. 24, 1988 [JP] Japan .................. 63-267886
[51] Int. Cl.$^5$ .................. G11C 11/44; H03K 3/38; H03K 5/13; H03L 7/00
[52] U.S. Cl. .................. 365/162; 307/306; 307/269
[58] Field of Search ........... 365/160, 162; 307/269, 307/306

[56] References Cited
FOREIGN PATENT DOCUMENTS
63-98219 4/1988 Japan .

OTHER PUBLICATIONS
S. M. Faris et al., "Basic Design of a Josephson Technology Cache Memory", IBM J. Res. Develop, vol. 24, No. 2, Mar. 1980.
W. H. Henkels, "Josephson Feedback Memory Cells", IBM Technical Disclosure Bulletin, vol. 18, No. 11, Apr. 1976.
W. H. Henkels, "Low–Current–Level Widest–Margin Josephson NDRO Cell", IBM Technical Disclosure Bulletin, vol. 21, No. 1, Jun. 1978.

Primary Examiner—Stuart N. Hecker
Assistant Examiner—Jack Lane
Attorney, Agent, or Firm—Staas & Halsey

[57] ABSTRACT

A Josephson memory circuit driven by first, second and third clock signals includes a write circuit which holds data as a circulating current circulating in a superconducting closed loop including a Josephson junction. The data to be held is supplied thereto through a data line with timing of the third clock signal. A first OR circuit is supplied with a bias from a read bias line with timing of the second clock signal and supplied with the circulating current. The first OR circuit has a Josephson junction which is switched to a finite resistance state by the circulating current. A second OR circuit is supplied as a bias with output data from the first OR circuit with timing of the second clock signal and supplied with a read address signal from a read address line with timing of the first clock signal. The second OR circuit has a Josephson junction which is switched to a finite resistance state by the read address signal. A third OR circuit is supplied with a bias from a read line with timing of the second clock signal and supplied with output data from the second OR circuit. The third OR circuit has a Josephson junction which is switched to a finite resistance state by the output data supplied from the second OR circuit. The data held in the write circuit is read out therefrom and transferred to the read line through the first, second and third OR circuits in this order.

11 Claims, 4 Drawing Sheets